(12) United States Patent
Kim et al.

(10) Patent No.: US 6,352,872 B1
(45) Date of Patent: Mar. 5, 2002

(54) SOI DEVICE WITH DOUBLE GATE AND METHOD FOR FABRICATING THE SAME

(75) Inventors: Hyung Ki Kim, Inch'on; Jong Wook Lee, Kyoungki-do, both of (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/712,705

(22) Filed: Nov. 14, 2000

Related U.S. Application Data

(62) Division of application No. 09/470,529, filed on Dec. 22, 1999, now Pat. No. 6,166,412.

(30) Foreign Application Priority Data

Dec. 26, 1998 (KR) .............................................. 98-58924

(51) Int. Cl.⁷ ............................................ H01L 21/338
(52) U.S. Cl. ............................ 438/24; 438/34; 438/23; 438/35
(58) Field of Search ............................. 438/24, 34, 23, 438/35, 167, 169, 604, 606, 158, 166, 907, 908, 151; 257/88, 83, 84; 216/79, 67

(56) References Cited

U.S. PATENT DOCUMENTS

| | | | |
|---|---|---|---|
| 5,789,766 A | * 8/1998 | Huang et al. | 257/88 |
| 5,827,753 A | * 10/1998 | Huang et al. | 438/24 |
| 5,893,721 A | * 4/1999 | Huang et al. | 438/34 |
| 6,177,302 B1 | * 1/2001 | Yamazaki et al. | 438/158 |
| 6,261,877 B1 | * 7/2001 | Yamazaki et al. | 438/151 |

* cited by examiner

*Primary Examiner*—Charles Bowers
*Assistant Examiner*—Laura M Schillinger
(74) *Attorney, Agent, or Firm*—Ladas & Parry

(57) ABSTRACT

A silicon-on-insulator (SOI) device having a double gate, comprising: a supporting substrate; a first insulating layer formed over the supporting substrate; a first silicon layer formed over the first insulating layer, the first silicon layer including a first impurity region of a first conductivity disposed in a central portion thereof and intrinsic regions disposed at the both sides of the first impurity region; a second insulating layer formed over the first silicon layer; a second silicon layer formed over the second insulating layer, the second silicon layer including a second impurity region of a second conductivity disposed in a central portion thereof and third impurity regions of first conductivities disposed at the both sides of the second impurity region; a third insulating layer formed over the second impurity region; and a polysilicon layer doped with impurity ions of first conductivities, formed over the third insulating layer.

5 Claims, 5 Drawing Sheets

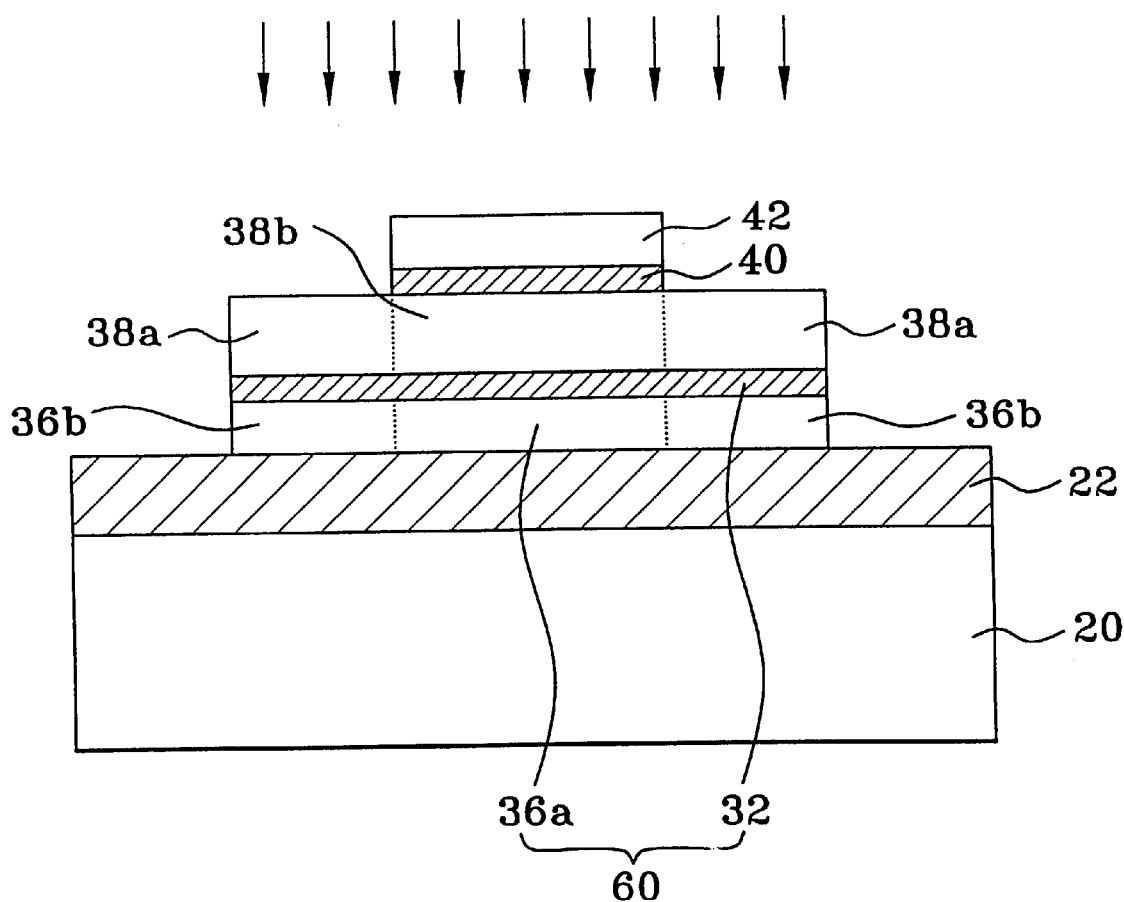

SOI DEVICE WITH DOUBLE GATE AND METHOD FOR FABRICATING THE SAME

This application is a division of U.S. Ser. No. 09/470,529 filed Dec. 22, 1999, now U.S. Pat. No. 6,166,412, which U.S. application is hereby incorporated herein by reference.

BACKGROUND OF THE INVENTION

This invention relates to a silicon-on-insulator (SOI) device, and more particularly to a SOI transistor having a double gate structure.

As demand on electronic appliance such as portable wireless electronic system is increased recently, the semiconductor device with high integration, high performance, low voltage and low power is interested and developed.

A method for lowering a threshold voltage of a MOSFET is typically used in accomplishing the lower driving voltage. However, the leakage current is increased due to the lowering threshold voltage of a MOSFET so that the electric characteristic of device is degraded. Various method for lowering a threshold voltage are proposed. Among various method, the semiconductor integration technology using a silicon on insulator (SOI) wafer where an oxide layer is sandwiched between two silicon layers is interested. The semiconductor device embodied in the SOI wafer has advantages of high performance due to low junction capacitance, low driving voltage due to low threshold voltage and removal of latch-up due to complete device isolation, as compared with the semiconductor device embodied in a silicon bulk wafer.

FIG. 1 is a sectional view of a SOI transistor embodied in a SOI wafer in the prior art. A SOI wafer 10 including a supporting substrate 11, a buried oxide layer 12 and a silicon layer 13 is prepared and an isolation layer 14 is formed in the silicon layer 13 to be contacted with the buried oxide layer 12. With a conventional process, a gate oxide 15 and a gate 16 are formed over the silicon layer 13 and source and drain regions 17 are formed in the silicon layer 13 at the both sides of the gates 16.

In the above SOI transistor, the source and drain regions 17 are formed to be contacted with the buried oxide layer 12 and the depletion region is removed to reduce the junction capacitance, thereby accomplishing the high performance. Besides, the complete device isolation is accomplished by the buried oxide layer 12 and the isolation layer 14 to prevent the latch-up.

However, the SOI transistor can accomplish the high performance due to the lower threshold voltage as compared with the conventional transistor, but there is a limit to lower the threshold voltage of the SOI transistor.

Recently, a study on a SOI device having a double gate has been progressed, which is fabricated in a SOI wafer and forms two gate in stack. The SOI device having a double gate can further lower the threshold voltage by controlling the voltages applied to two gates.

When the SOI device having a double gate is fabricated, the alignment between two gates becomes an essential factor. Following the lower gate formation, because an upper gate and a source and drain regions are formed in the lower gate, the misalignment between the lower and upper gates is occurred and it increases the capacitance due to the gate overlap, thereby causing the desired phenomenon such as a gate delay.

SUMMARY OF THE INVENTION

It is an object of the present invention to provide a SOI device having a double gate being capable of preventing the misalignment between lower and upper gates using a self-aligned contact and a method for fabricating the same.

According to an aspect of the present invention, there is provided to a silicon-on-insulator (SOI) device having a double gate, comprising: a supporting substrate; a first insulating layer formed over the supporting substrate; a first silicon layer formed over the first insulating layer, the first silicon layer including a first impurity region of a first conductivity disposed in a central portion thereof and intrinsic regions disposed at the both sides of the first impurity region; a second insulating layer formed over the first silicon layer; a second silicon layer formed over the second insulating layer, the second silicon layer including a second impurity region of a second conductivity disposed in a central portion thereof over the first impurity region of the first silicon layer and third impurity regions of first conductivities disposed at the both sides of the second impurity region over the respective intrinsic regions of the first silicon layer; a third insulating layer formed over the second impurity region of the second silicon layer; and a polysilicon layer doped with impurity ions of first conductivities, formed over the third insulating layer.

In the SOI device, the first conductivity is N-type and the second conductivity is P-type. On the contrary, the first conductivity is P-type and the second conductivity is N-type.

In the SOI device, the first impurity region of the first silicon layer serves as a lower gate. The first insulating layer serves as a buried oxide layer and is comprised of a thermal oxide layer. The second and third insulating layers serve as a lower gate oxide and an upper gate oxide, respectively. The intrinsic regions prevent the parasitic capacitance from the second impurity region and the first silicon layer. The second impurity region and the third impurity regions serve a channel region and source and drain regions, respectively. The polysilicon layer serves as an upper gate.

There is also provided to a method for fabricating a silicon-on-insulator (SOI) device having a double gate, comprising the steps of: preparing a supporting substrate and a device substrate; forming an insulating layer over the supporting substrate; implanting oxygen ions into the device substrate to form a first oxide layer within the device substrate; implanting hydrogen ions into the device substrate below the first oxide layer to form an ion implanting layer below the first oxide layer and to define a first silicon layer and a second silicon layer over and below the first oxide layer, respectively; bonding the device substrate and the supporting substrate to contact the insulating layer with the first silicon layer; removing a portion of the device substrate including the ion implanting layer until the second silicon layer is exposed; implanting impurity ions of a first conductivity into the first silicon layer; patterning the first and second silicon layers and the first oxide layer; forming a second oxide layer over the second silicon layer; implanting impurity ions of a second conductivity into the second silicon layer; forming a polysilicon layer doped with an impurity ions of first conductivities over the second oxide layer; patterning the polysilicon layer and the second oxide layer to form an upper gate having a width smaller than the lower gate; implanting impurity ions of a first conductivity into the first silicon layer using the upper gate as a barrier to form intrinsic regions at the both sides of the upper gate in the first silicon layer and a lower gate between the intrinsic regions; and implanting impurity ions of a first conductivity into the second silicon layer using the upper gate as a barrier to form source and drain regions at the both sides of the upper gate in the second silicon layer.

BRIEF DESCRIPTION OF THE DRAWINGS

The objects and features of the invention may be understood with reference to the following detailed description of an illustrative embodiment of the invention, taken together with the accompanying drawings in which:

FIG. 2A to FIG. 2H are sectional views illustrating a SOI transistor having a double gate in accordance with an embodiment of the present invention.

DETAILED DESCRIPTION OF THE INVENTION

Figure 1:
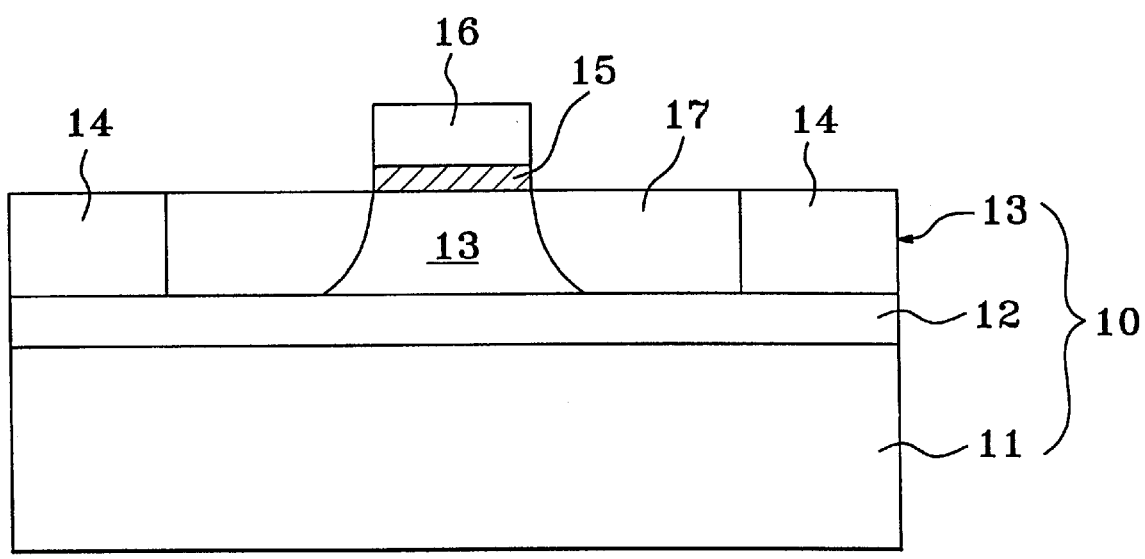
FIG. 1 is a sectional view of a SOI transistor in the prior art.
Figure 2A:
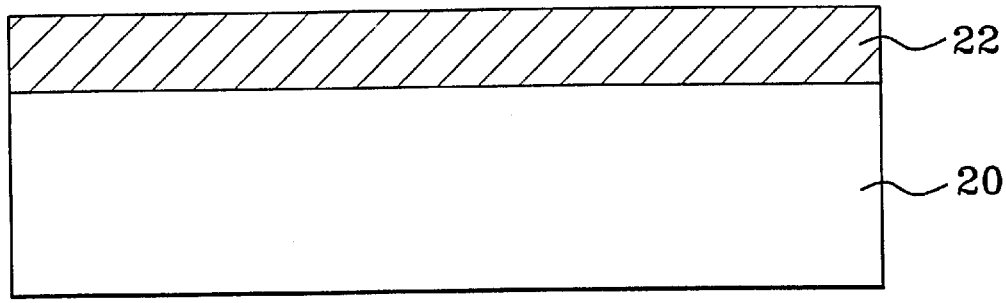

FIG. 2A to FIG. 2H are sectional views illustrating a method for fabricating a SOI transistor having a double gate in accordance with an embodiment of the present invention. Referring to FIG. 2A, a supporting substrate 20 being comprised of bulk Si, is prepared and a thermal oxide layer 22 is formed on the supporting substrate 20 with thermal oxidation. The thermal oxide layer serves as a buried oxide layer of a SOI wafer which is to be formed in the following process.

Figure 2B:
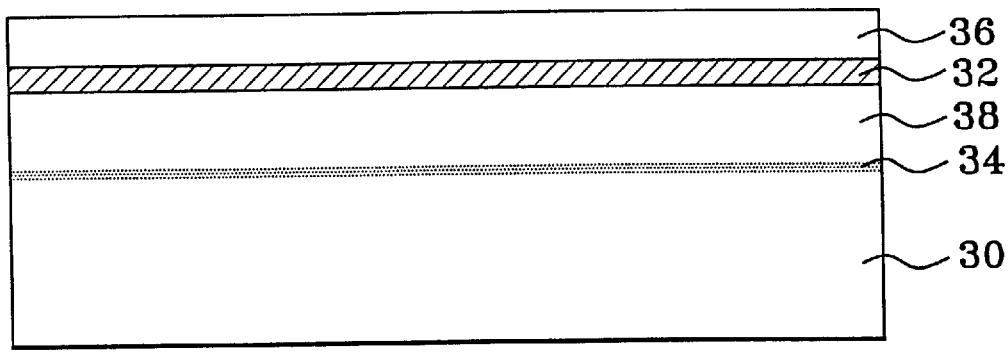

Referring to FIG. 2B, a device substrate 30 being comprised of bulk Si, is prepared. a first oxide layer 32 is formed within the device substrate 30 at a selected depth from a surface of the device substrate 30 by separation by implanted oxygen (SIMOX) method implanting oxygen ions into the device substrate 30 and then hydrogen ions are implanted into the device substrate 30 to form an ion implanting layer 34 below the first oxide layer 32.

By forming the ion implanting layer 34, a first silicon layer 36 and a second silicon layer 38 interleaving the first oxide layer 32 are defined over the device substrate 30. At this time, the first silicon layer 36 is formed over the first oxide layer 32 and the second silicon layer 38 is formed below the second oxide layer 32. The second silicon layer 38 serves as a device formation layer of the SOI wafer which is to be formed in the following process. The first silicon layer 36 and the first silicon layer 32 serve as a lower gate and a lower gate oxide which is to be formed in the following process. The ion implanting layer 34 is used in removing the unnecessary device substrate 30 in the following process called as smart cut technology as well known in the SOI fabrication process.

Figure 2C:
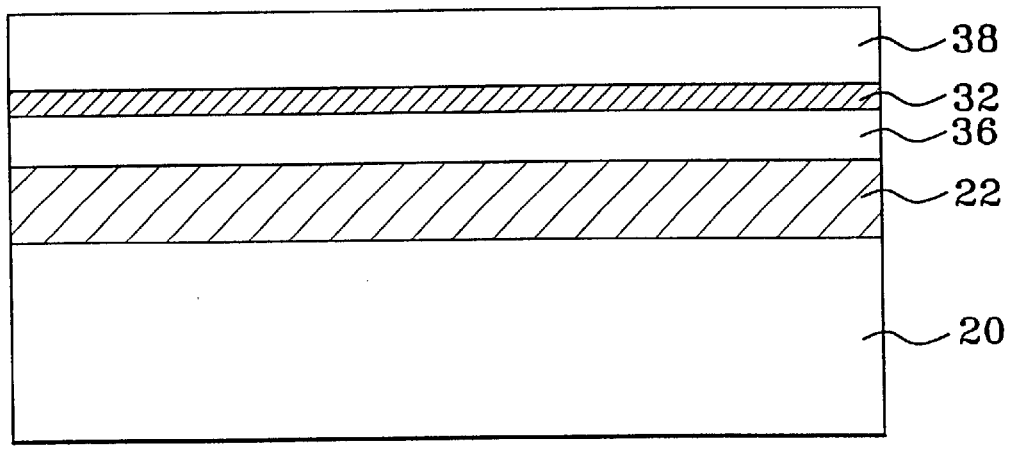

Referring to FIG. 2C, the device substrate 30 and the supporting substrate 20 are bonded to contact the thermal oxide layer 22 with the first silicon layer 36. So as to intensify the intensity of the bonding force between two substrates 20 and 30, a heat-treatment is carried out at a selected temperature. Then, the unnecessary device substrate 30 is cut so as to remove the ion implanting layer 34.

Figure 2D:
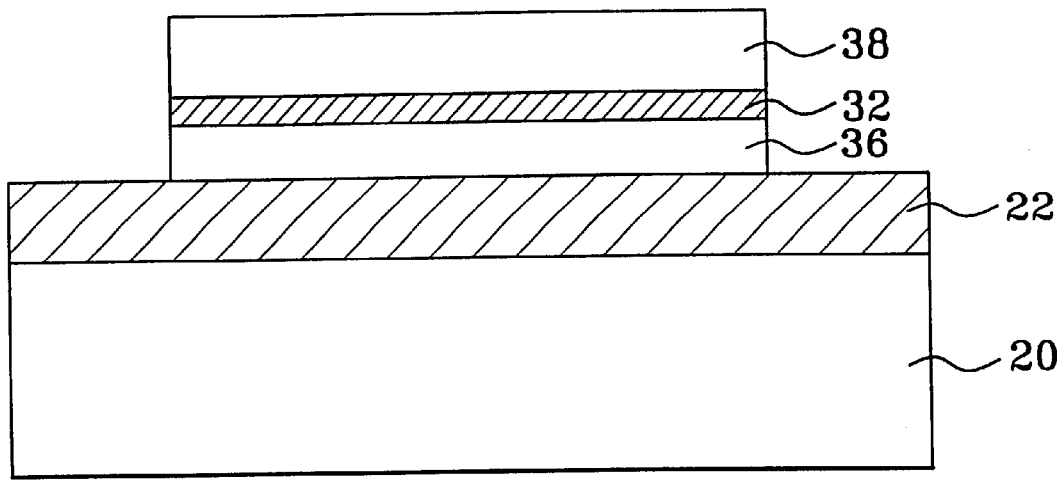

Referring to FIG. 2D, N$^+$ type impurity ions such as phosphorus (P) ions are implanted into the first silicon layer 36 and then the first and second silicon layers 36 and 38 and the first oxide layer 32 are patterned with the conventional dry etching process.

Figure 2E:
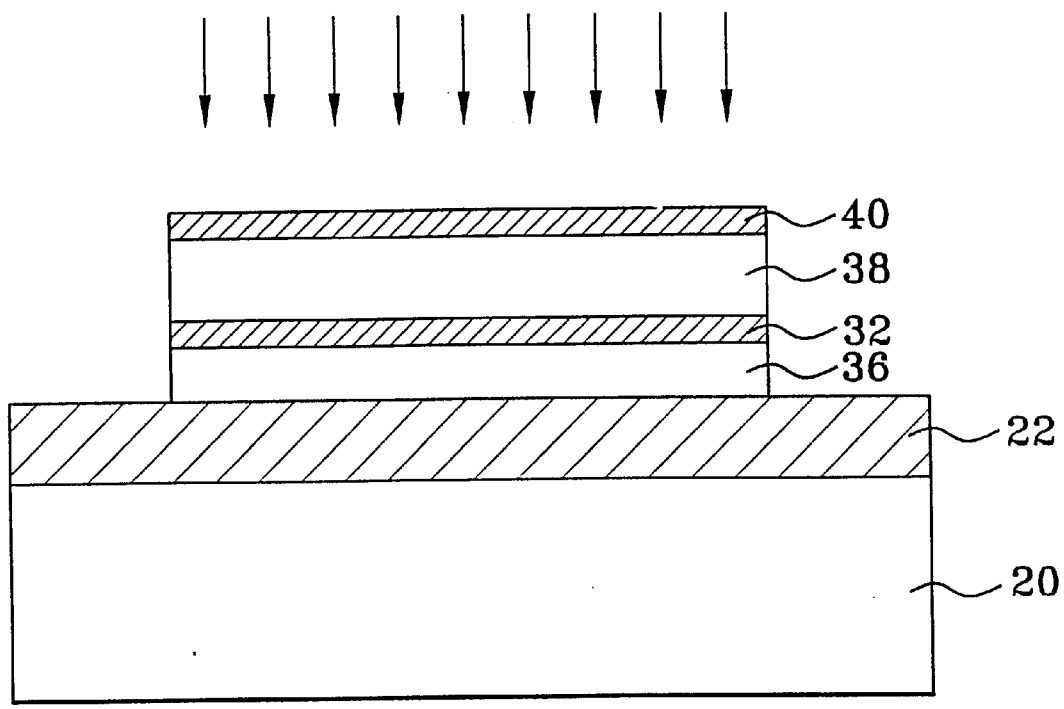

Referring to FIG. 2E, a second oxide layer 40 is deposited over the second silicon layer 38 with chemical vapor deposition (CVD) and P type impurity ions are implanted into the second silicon layer 38 so as to adjust a threshold voltage of a N type MOSFET.

Figure 2F:
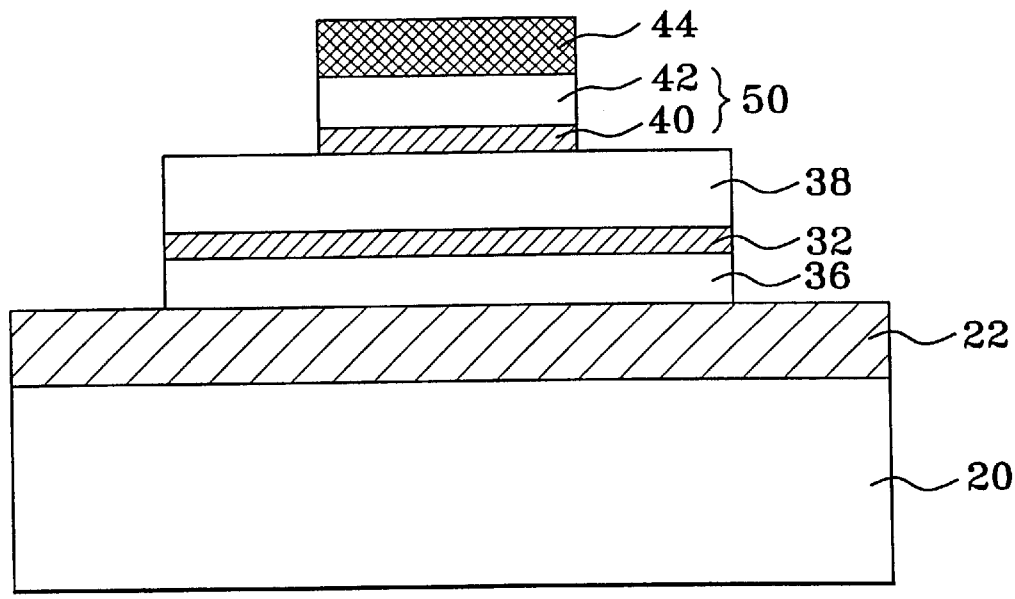

Referring to FIG. 2F, a N$^+$-doped polysilicon layer 42 is formed over the whole surface and the a photoresist pattern 44 is formed over the N$^+$-doped polysilicon layer 42. The N$^+$-doped polysilicon is deposited with CVD using SiH$_4$, Si$_2$H$_6$, or SiH$_2$cl$_2$. Through a conventional lithography process using the photoresist pattern 44 as an etching barrier, the polysilicon layer 42 and the second oxide layer 40 are patterned to a upper gate 50 including the polysilicon layer 42 and the second oxide layer 40 as an upper gate oxide. At this time, the photoresist pattern is formed so as to have a width smaller than the first and second polysilicon layers 36 and 38, thereby exposing the surfaces of the second silicon layer 38 where source and drain regions are to be formed in the following process.

Figure 2G:
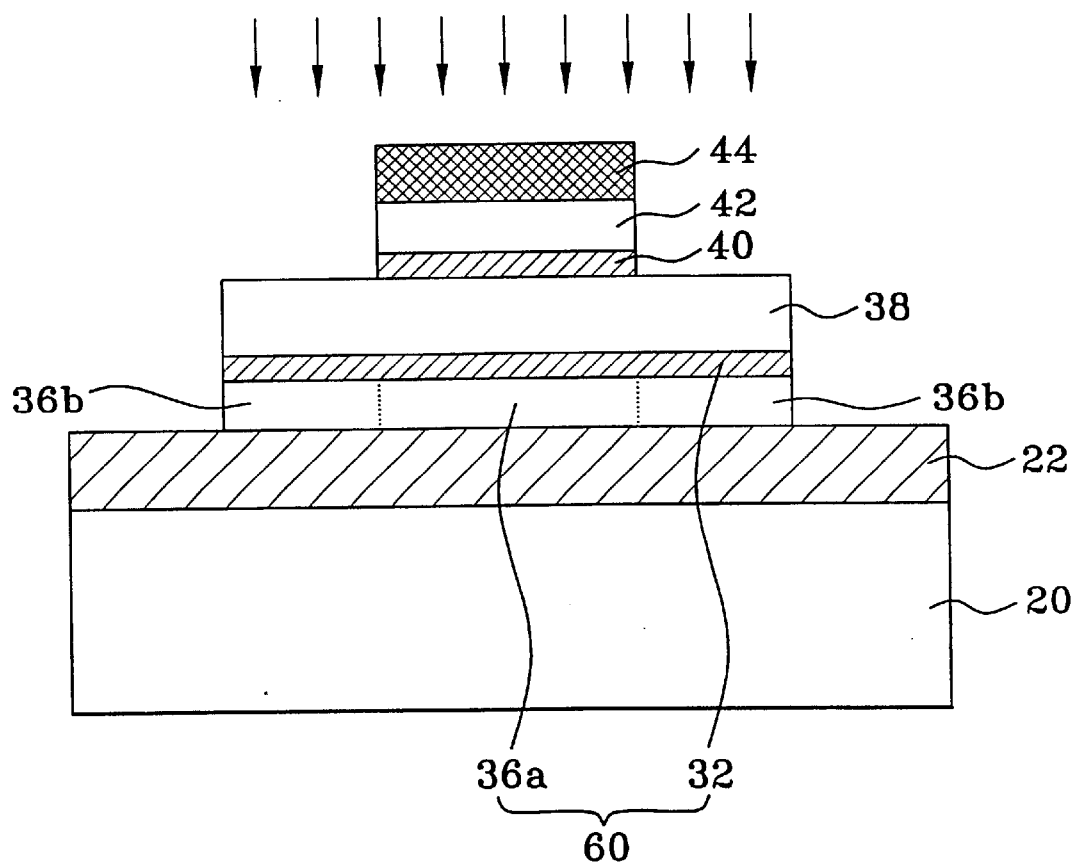

Referring to FIG. 2G, P type impurity ions which have an opposite conductivity to the N$^+$ type impurity ions doped in the first silicon layer 36, for example boron ions, are implanted into the firsts silicon layer 36 using the photoresist pattern 44 and the upper gate 50 as a barrier, so that intrinsic silicon layers 36b are formed in the first silicon layer at the both sides of the upper gate 50 and a lower gate 60 including a N$^+$-doped first silicon layer 36a between the intrinsic silicon layers 36b and the first oxide layer 32 as a lower gate oxide. The intrinsic silicon layers 36b prevents the parasitic capacitance from being generating between source and drain regions to be formed in the second silicon layer 38 and the portion 36a of the first silicon layer 36 implanted with the N$^+$ type impurity ions.

Referring to FIG. 2H, the photoresist pattern 44 is removed and then N type impurity ions are implanted into the exposed surfaces of the second silicon layer at the both sides of the upper gate 50 or the lower gate 60 to form the source and drain regions 38a and a P type channel region 38b between the source and drain regions 38a, thereby fabricating the SOI transistor having a double gate.

According to the preset invention, the SOI transistor having a double gate is formed with a self-aligned contact method and it can prevent the overlap capacitance from generating due to the misalign due to the gate overlap between the upper and lower gates. Besides, the two gates are electrically coupled to each other through the second silicon layer 38 where the source and drain regions are formed, so that it is easy to control the short effect and it can reduce the leakage current with the control of the voltage applied to the upper and lower gates. In particular, it can fabricate the SOI device having a lower threshold voltage and it is applicable to embody the semiconductor device with low driving voltage and high performance.

On the other hand, although the preferred embodiment describes the PMOS transistor fabricated in the SOI wafer, it is applicable to fabricate the NMOS transistor.

While the invention has been particularly shown and described with respect to preferred embodiment thereof, it will be understood by those skilled in the art that various changes in form and details may be made therein without departing from the spirit and the scope of the invention as defined by the following claims.

What is claimed is:

1. A method for fabricating a silicon-on-insulator (SOI) device having a double gate, comprising the steps of:

Preparing a supporting substrate and a device substrate;

Forming an insulating layer over the supporting substrate;

Implanting oxygen ions into the device substrate to form a first oxide layer within the device substrate;

Implanting hydrogen ions into the device substrate below the first oxide layer to form an ion implanting layer below the first oxide layer and to define a first silicon layer and a second silicon layer over and below the first oxide layer, respectively;

Bonding the device substrate and the supporting substrate to contact the insulating layer with the first silicon layer;

Removing a portion of the device substrate including the ion implanting layer until the second silicon layer is exposed;

Implanting impurity ions of a first conductivity into the first silicon layer;

Patterning the first and second silicon layers and the first oxide layer;

Forming a second oxide layer over the second silicon layer;

Implanting impurity ions of a second conductivity into the second silicon layer;

Forming a polysilicon layer doped with impurity ions of first conductivity over the second oxide layer;

Patterning the polysilicon layer and the second oxide layer to form an upper gate having a width smaller than a lower gate;

Implanting impurity ions of a first conductivity into the first silicon layer using the upper gate as a barrier to form intrinsic regions at both sides of the upper gate in the first silicon layer; and Implanting impurity ions of a first conductivity into the second silicon layer using the upper gate as a barrier to form source and drain regions at both sides of the upper gate in the second silicon layer.

2. The method as claimed in claim 1, wherein the first conductivity is N-type and the second conductivity is P-type.

3. The method as claimed in claim 1, wherein the first conductivity is P-type and the second conductivity is N-type.

4. The method as claim in claim 1, wherein the insulating layer serves as a buried oxide layer and is comprised of a thermal oxide layer.

5. The method as claimed in claim 1, wherein the intrinsic regions prevent the parasitic capacitance from the second impurity regions and the first silicon layer.

* * * * *